United States Patent [19]
Amazeen et al.

[11] Patent Number: 5,043,657
[45] Date of Patent: Aug. 27, 1991

[54] MARKING TECHNIQUES FOR IDENTIFYING INTEGRATED CIRCUIT PARTS AT THE TIME OF TESTING

[75] Inventors: Bruce E. Amazeen, Ipswich; Mark M. Martin, Methuen, both of Mass.

[73] Assignee: Analog Devices, Incorporated, Norwood, Mass.

[21] Appl. No.: 553,533

[22] Filed: Jul. 13, 1990

[51] Int. Cl.[5] .................... G01R 15/12; G01R 17/00
[52] U.S. Cl. ............................. 324/158 R; 324/73.1; 29/574
[58] Field of Search ............. 324/158 R, 158 F, 73.1; 437/8; 371/15.1, 20.1; 364/403; 29/593, 854, 620, 574

[56] References Cited

U.S. PATENT DOCUMENTS

| | | | |
|---|---|---|---|
| 4,255,851 | 3/1981 | Fortuna | 29/593 |
| 4,437,229 | 3/1984 | Bitler et al. | 324/158 F |
| 4,646,238 | 2/1987 | Carlson Jr. et al. | 364/403 |
| 4,853,628 | 8/1989 | Gouldsberry et al. | 324/158 R |
| 4,918,377 | 4/1990 | Buehler et al. | 324/159 R |

Primary Examiner—Kenneth A. Wieder
Assistant Examiner—Vinh P. Nguyen
Attorney, Agent, or Firm—Parmelee, Bollinger & Bramblett

[57] ABSTRACT

A technique for "marking" integrated-circuit (IC) chips so that, when large lots of the chips are drift-tested at different temperatues, each chip can be identified positively so as to be associated with the test data accumulated for the particular chip. The technique includes forming additional resistors on each IC chip with the resistors connected in series and to a voltage supply. The resistors are timmed at the wafer stage to produce at nodal points between the resistors voltages having magnitudes which uniquely identify each particular chip, thereby to permit part-identified tests to be performed after the chips have been packaged as parts ready for shipment.

10 Claims, 1 Drawing Sheet

MARKING TECHNIQUES FOR IDENTIFYING INTEGRATED CIRCUIT PARTS AT THE TIME OF TESTING

BACKGROUND OF THE INVENTION

1. Field of the Invention

This invention relates to the manufacture of integrated-circuit (IC) parts. More particularly, this invention relates to the testing of such parts at the end of the manufacturing process.

2. Description of the Prior Art

Integrated-circuit chips conventionally are packaged as completed products known as "parts". These parts generally comprise a large number of external pins through which electrical connection may be made to the circuitry on the chip. At the end of the manufacturing process, the pins of the completed parts typically are connected to automatic test equipment and given a series of electrical tests to determine the performance characteristics of the integrated circuitry. Frequently, such tests are used to "grade" the parts into commercial categories of performance capabilities, commonly identified by letters such as J, K, L, etc. U.S. Pat. No. 4,646,238 (Carlson et al) discloses how such grading fits into the computer-controlled planning of production and testing of IC parts.

Integrated circuits generally are formed on thin wafers of silicon in a series of alternating photographic and deposition processes which create hundreds and possibly thousands of identical circuits on each wafer. The wafers are processed in "lots" which typically will include 21 wafers in a so-called "boat". If, for example, each wafer included 600 IC chips or "dice", there would be 12,600 such chips in a wafer lot.

After circuit formation, the wafers are probed and each circuit powered up in order to make preliminary tests to determine which dice are non-functional and must be discarded. Frequently at this wafer stage of the process, certain elements of the integrated circuitry may be trimmed, as by laser trimming of resistors, to bring the values of such elements to within specified limits.

Thereafter, the individual dice of each wafer are separated, inspected for visual defects, and mounted in respective packages as described above, i.e. packages having a large number of external pins for making electrical connections to the integrated circuitry when the part is assembled together with other components to make a complete device. Very fine wires within each package connect these pins to bonding pads on the IC chip, which in turn make connection to corresponding points of the integrated circuitry.

After packaging, the parts are tested and graded according to their electrical performance against applicable specifications. The simplest grades may be tested only at room temperature. Higher quality grades, such as those for military and aerospace applications, generally must pass tight performance standards while being subjected to extreme environmental conditions, such as very high and very low temperatures. In addition, the critical characteristics of higher grade products often must be tested in such a way to assure that a parametric drift or temperature coefficient is not out of specifications with respect to an entire temperature range. Drift tests generally include at least three separate tests for each part, at different temperatures; sometimes as many as seven or eight separate tests may be required for each part.

When the parts are being drift-tested, it is essential to be able to establish the identity of each part in such a way as to positively associate each part with a corresponding set of test data covering different temperature conditions. Thus, as the parts are shifted from one test condition to another during a drift test, the identity of each part must in some fashion be continuously monitored or otherwise determined positively, so that errors will not be made in assigning the sequential sets of test data to particular parts.

Conventional IC test equipment frequently includes apparatus known as a "handler" into which parts to be tested are loaded for carrying out tests automatically. Prior to insertion into a handler the parts generally are carried in plastic tubes (sometimes called "sticks") which are elongate devices holding about 25 to 100 parts each, all arranged in a row. The parts are stripped from the tubes and loaded into the handler where they are physically transported through the test chamber while being brought up to the specified temperature. Each part thereafter is connected, in sequence, for a very short time to the test equipment circuitry which at high speed typically measures voltages and currents under a computer program control. The handlers include facilities to reassemble the parts back into tubes after a test run has been completed. Subsequent tests at different temperatures are carried out in the same fashion. A "test lot" for a handler typically may total 1500 parts.

The results of the computer-controlled electrical tests performed on the parts are stored in memory, and the procedures used are carried out so as to provide that the test data can in some fashion be associated with the respective parts. As noted above, for drift tests a series of readings must be made at different conditions. It is necessary that each set of such sequential readings stored in memory for a particular part always be positively associated in the memory with that same part, for otherwise the final analyses of the test data would yield faulty results.

Various techniques have been developed for establishing and/or monitoring the identity of the individual parts being tested, so as to assure that the test results for any one part are correctly associated with that part. Although such prior techniques have in some respects been effective, the overall results have not been fully satisfactory for many applications. For example, some prior techniques require that the carrying tubes have to be kept in their original sequence, and similarly that the parts be kept in their original sequence in each tube. As will be evident from the description hereafter, the present invention avoids the need for such ordering of the parts and/or tubes.

Accordingly, it is a purpose of this invention to provide improved techniques for marking and subsequently identifying IC parts as they pass through the test procedures at the end of an IC manufacturing process.

SUMMARY OF THE INVENTION

In one presently preferred embodiment of the invention, to be described in detail hereinafter, IC parts to be tested are marked for identification by a technique wherein the chips are formed with additional circuit elements which are trimmed at the wafer stage to provide a characterization unique to each part. In the specific example disclosed, three additional series-connected resistor elements are formed on each chip. The two nodal points between these three resistors are connected to bonding pads to be accessed during the wafer testing stage. During that testing stage, the two end resistors of the string are trimmed to provide at the two nodal points measurement voltages which when ratioed to a supply voltage provide a unique identification of the particular part.

When the parts subsequently are drift-tested, as in a "handler" as described above, the computer-driven testing program also measures the supply voltage and the voltages at the two resistor nodal points for each part, and records such voltages (or a corresponding calculated identification number) to be associated with the stored test data for the corresponding part. Thus, the accumulated test data are keyed positively to a correspondingly-stored identification of the particular part tested, permitting an accurate analysis of the test data to be made for all of the parts.

When all of the electrical tests have been completed, the handler may automatically reassemble the parts in the carrying tubes in accordance with the analysis of the stored test data, e.g., so as to bring together all parts meeting a common specification standard so that such parts will be ready for shipment to meet orders for the products.

Accordingly, it is an object of this invention to provide improved techniques for positively associating an integrated-circuit part with test data accumulated for such part during its manufacturing test procedures. Other objects, aspects and advantages of the invention will in part be pointed out in, and in part apparent from, the following detailed description of a preferred embodiment of the invention, considered together with the accompanying drawings.

DESCRIPTION OF A PREFERRED EMBODIMENT

Figure 1:
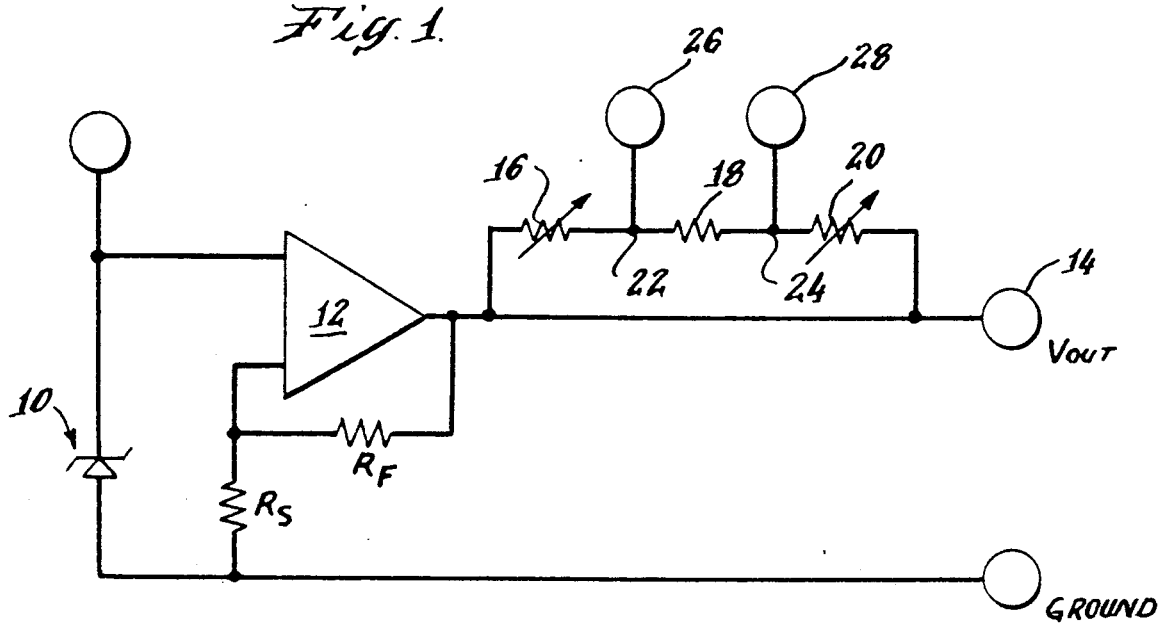
FIG. 1 is a circuit diagram showing an additional set of resistors formed on an IC chip for marking and subsequently identifying each individual part.

Referring now to FIG. 1, the exemplary embodiment of the invention described herein is a voltage reference chip which in this case comprises a Zener diode 10 coupled to an amplifier 12 having the usual feedback resistors, and serving to produce the reference output voltage at an output terminal 14. Each chip is "marked" for subsequent identification by including on the chip three additional resistors 16, 18 and 20, formed simultaneously with the formation of the rest of the IC circuitry for the voltage reference (not shown). In the exemplary embodiment, the nominal values of these resistors were 36K, 45K and 36K respectively.

These three resistors 16, 18 and 20 are connected in series, with both ends of the string being connected to the reference output voltage (nominally 10 volts in the exemplary embodiment) appearing at output terminal 14. The two nodal points 22, 24 between the resistors are brought out through the usual bonding pads as respective circuit points 26, 28. In the final packaged part, these bonding pads are connected to respective external pins (not shown) which are otherwise unused for the voltage reference.

When the IC fabrication process reaches the end of the wafer stage, the individual integrated circuits of the wafer are powered up (as described above) and probed for test purposes, and possibly for carrying out a conventional trimming operation of elements of the integrated circuitry. As part of that procedure, the resistors 16 and 20 are trimmed to provide measured parameters unique to each chip, as will now be described, so as to "mark" each chip for subsequent identification.

This marking procedure in the disclosed embodiment comprises making voltage measurements while trimming the resistors 16 and 20 as set forth in the two steps outlined below:

1. Ground circuit point 26 and measure the voltage $V_{OUT}$ and the voltage at circuit point 28 to produce the ratio:

$$V_{28}/V_{OUT} = R_{18}/(R_{18}+R_{20})$$

2. Ground circuit point 28 and measure the voltage $V_{OUT}$ and the voltage at circuit point 26 to produce the ratio:

$$V_{26}/V_{OUT} = R_{18}/(R_{18}+R_{16})$$

During step (1) above, the value of resistor 20 ($R_{20}$) is trimmed to produce a predetermined voltage ratio (performing the function of a code) identifying the wafer number of the particular chip being probed. This voltage ratio is employed in this particular preferred embodiment by using five voltage ratios (codes) per wafer. For example, wafer number 1 will have codes of 0.545, 0.544, 0.543, 0.542 and 0.541, with each code identifying a segment of wafer number 1 containing 120 dice. Subsequent wafers will follow the same pattern, down to 0.441 for the last segment code of wafer 21 (the last wafer of a full-boat lot of wafers). This will provide for coding of 105 wafer segments (5 segments per wafer, times 21 wafers).

During step (2) above, the value of resistor 16 ($R_{16}$) is trimmed to produce a predetermined voltage ratio (again performing the function of a code) identifying the die on the wafer then being trimmed. In the specific embodiment described herein, the resistor 16 of the first good die is trimmed to provide a measured voltage ratio of 0.545. Subsequent good dice in the particular wafer segment will be trimmed to ratios 0.001 lower until 120 dice have been coded, with die number 120 being set to 0.426. Die number 121 of the wafer (this second segment of the wafer being coded by $R_{20}$ as 0.544) will start the code pattern for the dice over again at 0.545, as will die numbers 241, 361 and 481. With five wafer codes per wafer, each covering 120 dice, this coding arrangement will accommodate up to 600 good dice per wafer.

As an example of the described coding arrangement, for die number 245 on wafer number 3 a voltage ratio of 0.533 will be set at circuit point 26 by appropriately trimming resistor 20, and a voltage ratio of 0.541 will be set at circuit point 28 by appropriately trimming resistor 16.

During subsequent testing of the packaged IC parts, as described above, the following formula is used (as a computer algorithm) to convert the coding (voltage ratio measurements) to an integer to use as an index variable for identifying the part to which particular test data pertains:

Part I.D.
No. = 120(545 − 1000($V_{26}$/$V_{OUT}$)) + 546 − 1000($V_{28}$/$V_{OUT}$)

where
$V_{26}$ is the voltage at circuit point 26, and
$V_{28}$ is the voltage at circuit point 28.

The part I.D. (identification) numbers as determined by this formula are stored in memory, e.g. in a hard disc, together with the drift test data associated with each such part. Thus, the complete test data, under the specified different test conditions, can be analyzed with assured identification of the parts to which the test data pertains. The results of the computer analysis of the test results can be employed to control the handler in its reassembly of the tested parts into the tubes in such a fashion that parts meeting common test specifications will be placed together in the same tube(s) for subsequent shipment to customers.

It will be seen that this marking technique avoids any need for assuring that the individual parts are positioned in any particular order, either in the handler or in their carrying tubes. Further, the parts need not be loaded into the handler directly from carrying tubes, and can instead be loaded in random fashion, as in a loading procedure known as "bowl feed".

As noted above, the measured electrical voltages at the circuit points 26, 28 are taken out through otherwise-unused pins of the packaged part (i.e. pins which are not necessary for making connection to the functional integrated circuitry of the part). The marker technique disclosed herein can however be used with parts where all of the pins are otherwise assigned, as by multiple use of certain pins, as permitted by the nature of the particular integrated circuitry of the part.

Figure 2:
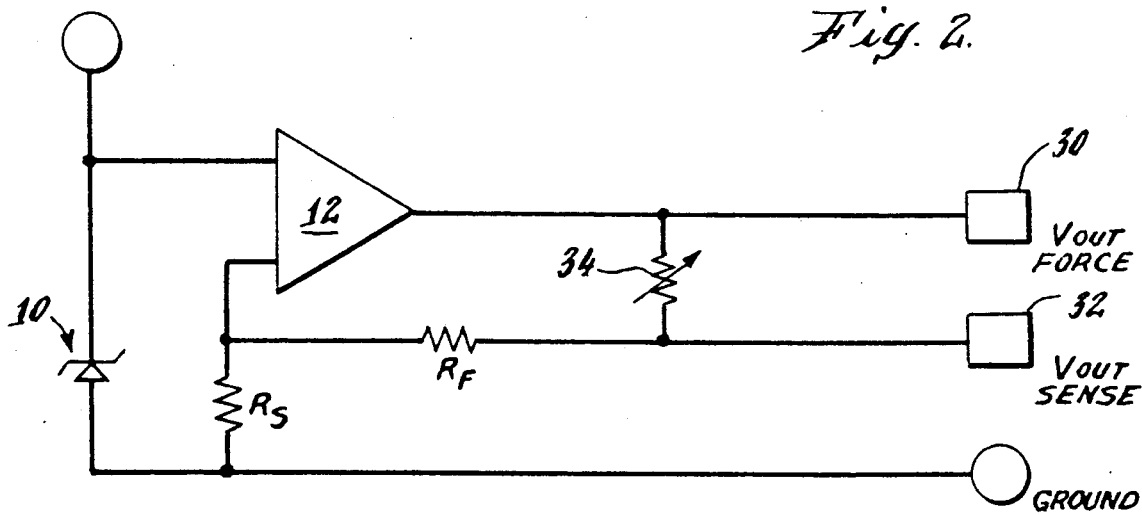
FIG. 2 shows a modified arrangement capable of measuring part-identification voltages through circuit points which are also used for making connection to the integrated circuitry on the chip.

FIG. 2 shows an arrangement somewhat like that of FIG. 1, wherein the device output pins 30, 32 provide "$V_{OUT}$ (FORCE)" and "$V_{OUT}$ (SENSE)" voltages respectively. Bridged across these pins is an internal trimmable resistor 34 formed with the other integrated circuitry. The customer must connect the pins 30 and 32 together, for proper operation of the device, although the connection can be made at a remote point where an accurate voltage is needed. However, for part-identification purposes the pins are unconnected, and the additional resistor 34 is trimmed (at the wafer stage) to produce a predetermined voltage ratio unique to the part, as:

$$V_{OUT}(FORCE)/V_{OUT}(SENSE) = (R_S + R_F + R_{34})/(R_S + R_F).$$

Accordingly, although specific preferred embodiments of the invention have been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. The method of marking and subsequently identifying each one of a large group of IC parts comprising semiconductor chips formed with integrated circuitry designed for a specific functional purpose, such marking and identifying being carried out to enable part-identified tests to be performed on the functioning of the integrated circuitry of each part, said method comprising the steps of:

forming on each chip at least one circuit element additional to said integrated circuitry;

trimming a parameter of each said additional circuit element while making measurements of an electrical value affected by said parameter;

said trimming being carried out so as to provide for each said additional circuit element an electrical value which is unique to the corresponding part;

conducting said tests to obtain a series of test data for said parts respectively;

determining said trimmed electrical values for each of the tested parts; and storing said series of test data respectively in association with a parameter-value-generated identification of the corresponding part, thereby to permit analyses of the test data to be made and associated with the tested part respectively.

2. The method of claim 1, wherein said additional circuit element is a resistor.

3. The method of claim 2, wherein the measured electrical value is a voltage ratio.

4. The method of claim 1, wherein said at least one additional circuit element comprises two additional circuit elements formed on each IC chip;

electrical values associated with said circuit elements being used to identify two separate characteristics.

5. The method of claim 4, wherein the electrical values for said two circuit elements are used to identify a wafer number and a die number in the particular wafer.

6. The method of claim 5, wherein multiple different electrical values are used for separate segments of each wafer.

7. The method of claim 6, wherein the electrical values measured are voltage ratios.

8. The method of claim 1, wherein each chip is formed with three additional circuit elements comprising resistors, connected in series;

connecting a supply voltage to said series-connected resistors of each chip; and making electrical voltage measurements to determine the ratios of inter-resistor nodal point voltages to said supply voltage;

said resistors being trimmed so as to provide voltage ratios identifying particular wafer numbers, and also voltage ratios identifying particular die numbers.

9. The method of claim 8, wherein both ends of the resistor string are connected to said supply voltage;

a first one of said ratios being obtained by grounding one of said nodal points and measuring the ratio of the other nodal point voltage to said supply voltage;

the other of said ratios being obtained by grounding the other nodal point and measuring the ratio of the one nodal point voltage to said supply voltage.

10. The method of claim 1, wherein the measurements of said electrical values are made through circuit points which are also used for making connection to said integrated circuitry as part of the functional operation of said integrated circuitry.

* * * * *